US012019967B2

(12) United States Patent
Ren et al.

(10) Patent No.: US 12,019,967 B2
(45) Date of Patent: Jun. 25, 2024

(54) ROUTING CONNECTIONS IN INTEGRATED CIRCUITS BASED ON REINFORCEMENT LEARNING

(71) Applicant: Nvidia Corporation, Santa Clara, CA (US)

(72) Inventors: Haoxing Ren, Austin, TX (US); Matthew Fojtik, Chapel Hill, NC (US)

(73) Assignee: NVIDIA Corporation, Santa Clara, CA (US)

(*) Notice: Subject to any disclaimer, the term of this patent is extended or adjusted under 35 U.S.C. 154(b) by 212 days.

(21) Appl. No.: 17/230,016

(22) Filed: Apr. 14, 2021

(65) Prior Publication Data
US 2021/0342516 A1    Nov. 4, 2021

Related U.S. Application Data

(60) Provisional application No. 63/019,892, filed on May 4, 2020.

(51) Int. Cl.
  *G06N 3/04*     (2023.01)
  *G06F 30/27*    (2020.01)
  *G06F 30/394*   (2020.01)
  *G06N 3/08*     (2023.01)

(52) U.S. Cl.
  CPC ............ *G06F 30/394* (2020.01); *G06N 3/04* (2013.01); *G06N 3/08* (2013.01)

(58) Field of Classification Search
  CPC ........ G06F 30/394; G06F 30/27; G06F 30/33; G06F 30/398; G06N 3/04; G06N 3/08; G06N 3/045; G06N 3/048; G06N 3/006; G06N 3/084
  See application file for complete search history.

(56) References Cited

U.S. PATENT DOCUMENTS 11,304,800 B2 *   4/2022   Tuval .................... A61F 2/2436
11,709,987 B2 *   7/2023   Lin ........................ G06N 20/10
                                                              716/119

OTHER PUBLICATIONS

Zhang Yihao, Deep Reinforcement Learning on 1-layer Circuit Routing Problem, thesis, university in Illinois, 2018, pp. 1-24 (Year : 2018).*
van Cleeff, et al.; "BonnCell: Automatic Cell Layout in the 7nm Era"; IEEE Transactions on Computer-Aided Design of Integrated Circuits and Systems; Dec. 30, 2019; 14 pgs.

(Continued)

*Primary Examiner* — Nghia M Doan

(57) ABSTRACT

The disclosure provides a general solution for determining connections between terminals of various types of circuits using machine learning (ML). A ML method that uses reinforcement learning (RL), such as deep RL, to determine and optimize routing of circuit connections using a game process is provided. In one example a method of determining routing connection includes: (1) receiving a circuit design having known terminal groups, (2) establishing terminal positions for the terminal groups in a routing environment, and (3) determining, by the RL agent, routes of nets between the known terminal groups employing a model that is independent of a number of the nets of the circuit. A method of creating a model for routing nets using RL, a method of employing a game for training a RL agent to determine routing connections, and a RL agent for routing connections of a circuit are also disclosed.

41 Claims, 5 Drawing Sheets

(56) References Cited

OTHER PUBLICATIONS

Ryzhenko, et al.; Standard Cell Routing via Boolean Satisfiability:; DAC 2012; Jun. 3-7, 2012; 10 pgs.
Zhang; "Deep Reinforcement Learning On 1-Layer Circuit Routing Problem"; thesis, University of Illinois at Urbana-Champaign; 2018; 27 pgs.

* cited by examiner

ROUTING CONNECTIONS IN INTEGRATED CIRCUITS BASED ON REINFORCEMENT LEARNING

CROSS-REFERENCE TO RELATED APPLICATION

This application claims the benefit of U.S. Provisional Application Ser. No. 63/019,892, filed by Mark Ren, et al. on May 4, 2020, entitled "A STANDARD CELL ROUTING METHOD ON SUB-10NM FINFET TECHNOLOGY BASED ON DEEP REINFORCEMENT LEARNING," commonly assigned with this application and incorporated herein by reference in its entirety.

STATEMENT OF GOVERNMENT INTEREST

This invention was made with US Government support under Agreement HR0011-18-3-0010, awarded by DARPA. The US Government has certain rights in the invention.

TECHNICAL FIELD

This application is directed, in general, to circuits and, more specifically, to routing connections between terminals of integrated circuits.

BACKGROUND

An integrated circuit (IC) is a collection of electrical components that are connected together in a certain way for a common purpose. ICs are often referred to as "chips" and can be found on the circuit boards of common household devices, such as televisions, computers, and garage door openers. The electrical components of an IC, such as transistors, resistors, capacitors, etc., are connected together to perform the common purpose according to several design steps.

The design steps, also referred to as a design flow, typically include system specification, system level design, functional and logic design, circuit design, physical design, and physical verification and signoff. The physical design includes planning the layout of the different electrical components, placing the electrical components, and determining the routing of the connections between terminals of the electrical components. A Physical Verification Tool is used to check the physical design. Design rules are provided as an input to the Physical Verification Tool and used to perform a Design Rule Check (DRC) to achieve reliability in the design. After the physical verification and signoff, ICs are fabricated, packaged, and tested. The finished products are then ready to be used.

SUMMARY

In one aspect, the disclosure provides a method of creating a model for routing nets of circuits using reinforcement learning. In one example, the model includes: (1) creating a first image that represents connecting a group of terminals of a circuit in a routing environment using a net and a second image that represents blockages in the routing environment for the connecting, wherein the first and second images have multiple routing layers and are created for at least some of the nets of the circuit, (2) creating, using a neural network (NN), a feature space image for the at least some of the nets based on the first and second images of the at least some of the nets, and (3) creating a policy function that provides a probability for choosing a routing action for connecting the group of terminals based on the feature space image of the at least some of the nets, wherein parameters of the policy function are independent of a number of the nets of the circuit.

In another aspect, the disclosure provides a method of training a RL agent, employing a game, to determine routing connections for circuits. In one example, this method includes: (1) observing, by the RL agent, a current routing state between terminal positions of a circuit in a routing environment, (2) providing, from the RL agent to the routing environment, a routing action that changes the current routing state between the terminal positions, wherein the RL agent provides the routing action based on a model for routing nets that is independent of a number of the nets of the circuit, (3) evaluating, by the routing environment, the routing action, and (4) providing, from the routing environment to the RL agent, one or more reward based on the evaluating.

In still another aspect, the disclosure provides a method of determining routing connections between terminals of a circuit employing a game process for a RL agent. In one example the method of determining routing connection includes: (1) receiving a circuit design having known terminal groups, (2) establishing terminal positions for the terminal groups in a routing environment, and (3) determining, by the RL agent, routes of nets between the known terminal groups employing a model that is independent of a number of the nets of the circuit.

In an additional aspect, the disclosure provides a RL agent for routing connections of a circuit. In one example, the RL agent includes: (1) a function approximator that generates routing actions for connecting terminal groups of nets of the circuit based on probabilities for taking different routing actions, and send the routing actions to a routing environment, and (2) a learning processor that receives game images from the routing environment and provide therefrom parameters for the function approximator that are independent of a number of nets of the circuit.

BRIEF DESCRIPTION

Reference is now made to the following descriptions taken in conjunction with the accompanying drawings, in which.

Figure 7:
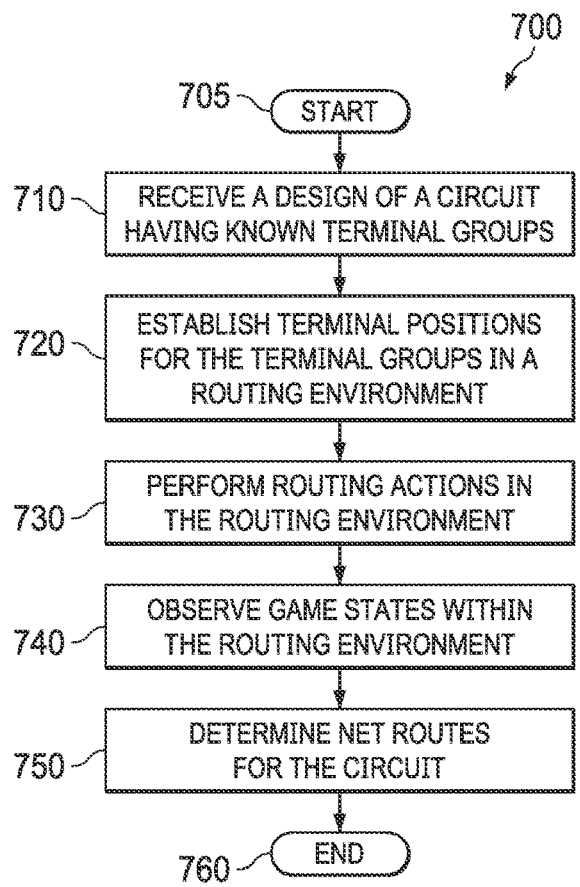
Figure 8:
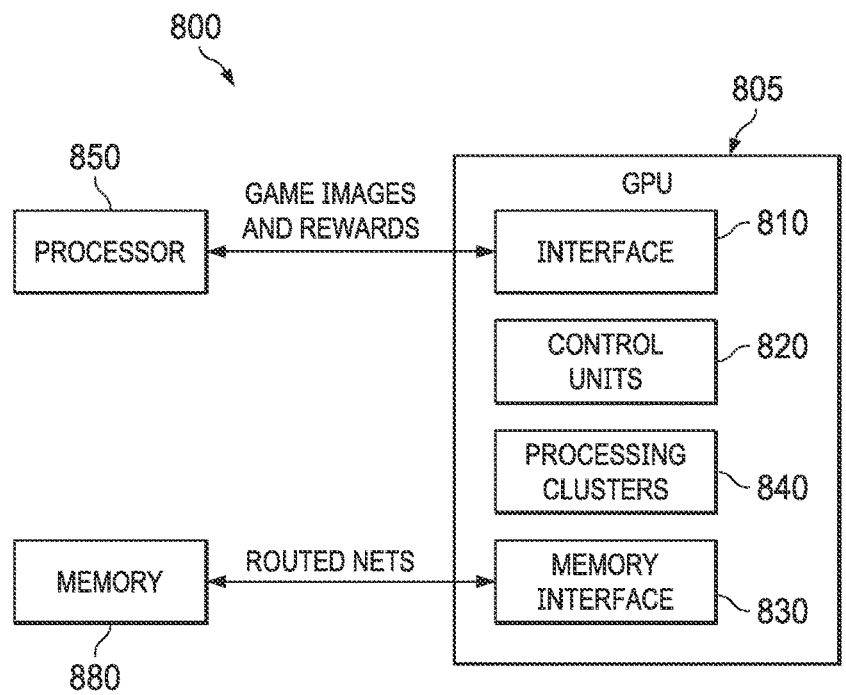

FIG. 7 illustrates a flow diagram of an example of a method of determining routing connections between terminal groups of a circuit employing a game process and a RL agent according to the principles of the disclosure; and FIG. 8 illustrates a block diagram of an example of a computing system in which at least a portion of the disclosed systems, methods, or apparatuses disclosed herein can be implemented.

DETAILED DESCRIPTION

As the complexity of ICs continue to increase, so does the need for an automated approach for determining connections between the terminals of the ICs, such as the terminals of standard cells. Standard cells are the building block of digital very-large scale integration (VLSI) designs. GPUs, for example, are made with hundreds to millions of these standard cells. Design groups, such as for automatic test generation (ATG) and VLSI, for each technology node are often required to design thousands of standard cells, which can take 10-15 designers 8-12 months to design them manually. One of the difficulties in providing the designs relates to the cell area significantly influencing the performance and cost of chips. As such, design teams work to minimize the cell area as much as possible. Routing connections between terminals of ICs can greatly affect the physical size of the ICs. Routing on smaller technology nodes, such as 10 nm or less, can be difficult due to available space and design rules that are stricter than earlier technology nodes. For example, routing within standard cells on FinFET technology nodes such as 7 nm and 5 nm is challenging wherein each routing layer can only route one direction, either horizontal or vertical.

Various automation approaches currently exist for determining connection routes, such as methods that leverage mathematic optimization techniques and analytical routing models. These current methods, however, can be limited by the assumption that all design rules can be expressed as linear constraints for integer programming models. Additionally, some current methods require precomputing suboptimal routing candidates before starting the solving process.

In contrast to the limitations of existing methods, the disclosure provides a general solution to determining connections between terminals of circuits. Disclosed herein is a machine learning (ML) based method that uses reinforcement learning (RL), such as deep RL, to determine routing of connections for circuits. The disclosed ML method leverages RL to optimize routing of circuit connections using a game process. In the method, an agent is trained to complete a task of routing connections for a circuit within a routing environment. The agent sends routing actions to the routing environment and in return receives observations and rewards from the routing environment. The rewards provide a measurement of the success of a routing action with respect to completing a routing task within the routing environment.

For example, the disclosed method collects and tracks the game process of routing connections in a circuit. The game can be played multiple times and record the rewards the RL agent collects while playing the game. The routing actions of the game are controlled by a policy network, which can be a neural network (NN), wherein the parameters of the NN control the policy. The policy can relate to the probability to choose a routing action, wherein if there is a high probability for a certain routing action, that routing action will probably be chosen.

After game playing, the average number of rewards given to the RL agent can be determined for a given set of parameters. Accordingly, a policy to be optimized can be determined that has the parameters as an input and the average award as the output. The game, therefore, can be run for a number of iterations while tracking the parameters and resulting rewards. The parameters can be optimized and then another set of parameters and rewards can be tracked and optimized. Additionally, the automated routing disclosed herein can enable technology design co-optimization allowing, for example, simultaneously optimizing standard cell design templates and GPU designs to achieve even better performance.

Unlike at least some existing methods, the ML method disclosed herein is agnostic to at least one of the number of nets and the size of the circuits. In other words, the parameters for the policy network are independent of the number of nets, the size of the circuits, or a combination of both. A net is a collection of terminals of a circuit that are connected together. Routing a net of a circuit is connecting the terminals, i.e. a terminal group, of the net. A terminal group is two or more terminals and a circuit can have multiple terminal groups. A netlist, which is a description of the connectivity of a circuit, includes a list of the electronic components in a circuit and a list of the terminals in which the components are connected. Accordingly, the number of nets for a circuit can be determined from the netlist. The ML method disclosed herein can create a NN using all of the nets of a circuit or using less than all of the nets of a circuit. For example, one or more nets of a circuit can be pre-routed using a conventional routing algorithm and the remaining nets can be routed using the ML method as disclosed herein.

The ML method as disclosed herein can speed-up the design process and also achieve the same cell area as a manual design. Trained on circuit data, the RL agent learns to create quality routes for connecting terminals of the nets, either some or all, of a circuit. The RL agent can then be applied to new circuits directly or retrained on the new circuits to achieve even better results. The circuits can be an IC of various technology nodes, including FinFET technology at 7 nm and 5 nm. The circuits can be standard cells or manual designs.

Figure 1:
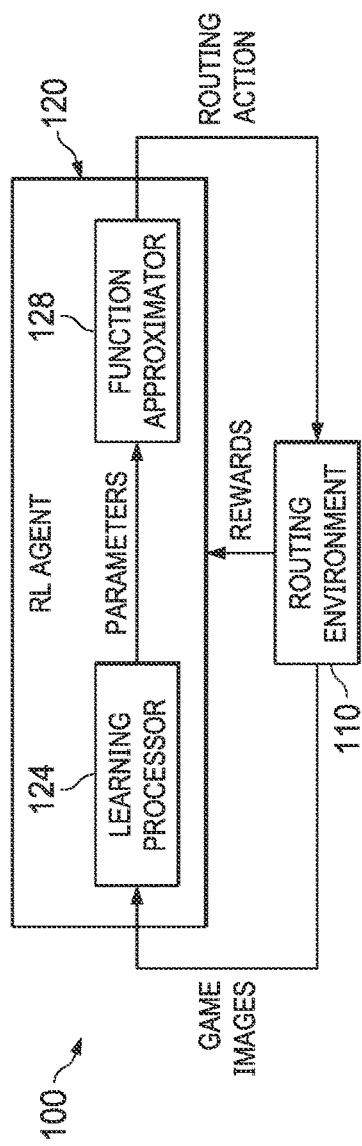
FIG. 1 illustrates a block diagram of an example of a circuit routing system constructed according to the principles of the disclosure.

FIG. 1 illustrates a block diagram of an example of a circuit routing system 100 constructed according to the principles of the disclosure. The circuit routing system 100 is a RL system that determines optimal connection routes between terminal groups of a circuit's nets. The circuit routing system 100 can determine connection routes for all of a circuit's nets or less than all of the circuit's nets. For example, other types of routing algorithms or systems can be used for routing one or more of the nets and the circuit routing system 100 can be used for the remaining nets. The circuit routing system 100 includes a routing environment 110 and a RL agent 120. The circuit routing system 100 is configured to model the routing process for a circuit as a game process for the RL agent 120 using the routing environment 110.

Figure 3:
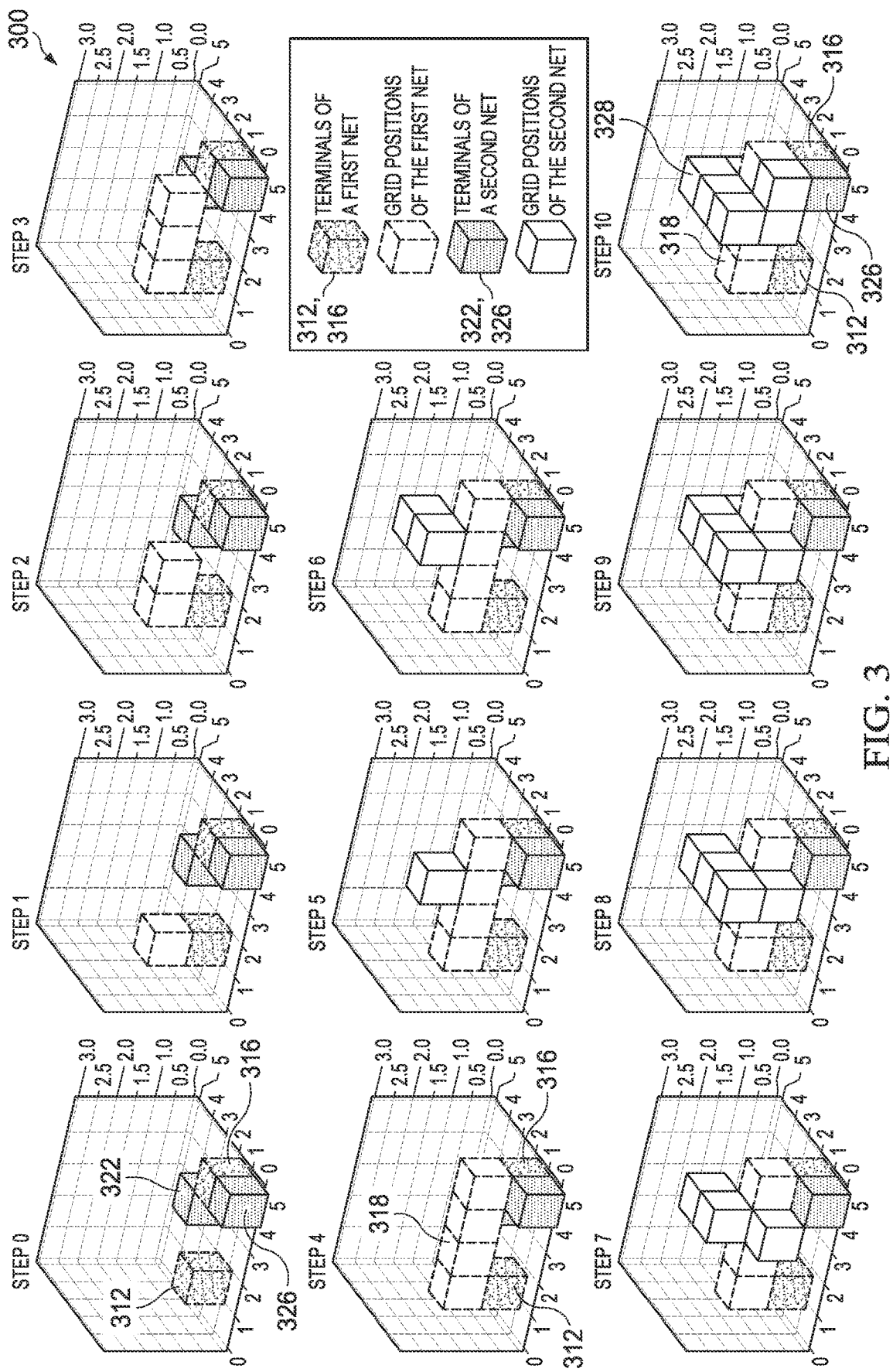
FIG. 3 illustrates an action sequence of an RL agent to route two nets in a routing environment of three dimensional space and provides an example of creating three-layer images for a learning processor of a RL agent.

The routing environment 110 is a game environment that represents a grid space for connecting terminal groups of the circuit's nets. The routing environment can be a grid-based routing environment with three layers and a three dimensional grid, such as represented in FIG. 3. The three layers can be a terminal layer, a horizontal layer, and a vertical layer. The routing environment 110 will route nets according to routing actions generated by the RL agent 120. The routing environment 110 evaluates the new routing action and sends the RL agent 120 at least one reward. The routing environment 110 can evaluate the new routing action by determining, for example, if the routing action completes a connection between a terminal group, if the routing action adds a segment for completing the connection, if the routing action complies with DRC, etc. The routing environment 110 produces rewards based on a current routing state, i.e., a game state, and the action, such as, for example, performed via a classic agent-environment loop. The rewards generated can include three different types. One type of reward indicates whether a routing action is illegal or not. These are negative rewards to prevent the agent from creating illegal actions. Another type of reward indicates whether the new routing action created a connected routing segment, i.e. the new routing action is connected to a terminal. These are examples of positive rewards to encourage the RL agent 120 to take routing actions that connect with existing terminals. A third type of reward is net routing rewards, which are given when a net is fully routed. The amount of that reward can be associated with the routed wirelength. A shorter wire length can result in larger rewards to encourage the RL agent to optimize lengths of wires, i.e., connections.

In addition to the routing rewards given by the routing environment 110, the routing environment 110 can also give DRC rewards. For one, multiple, or every game step, the routing environment 110 can evaluate the DRCs of current routing and compute the number of DRCs. A game step corresponds to a performed routing action. FIG. 3 provides examples of various game steps in a routing environment. If the current DRC number is higher than the previous DRC number, the routing environment 110 can generate a negative reward to the agent, otherwise a positive reward.

The routing environment 110 will also send game state images (i.e., game images) to the RL agent 120. The game images represent the game state space of the routing environment 110 that includes the results of the current routing action in the grid space and the observations of the routing environment 110. The game images can correspond to two images created for each net, or at least some of the nets, of the circuit: one for the routing of the net itself, and one for the routing of everything else, which represents blockages to the particular net.

The RL agent 120 observes the current game state in the routing environment 110 and sends a routing action to the routing environment 110 that will change the current game state for a net of the circuit. The RL agent 120 includes a learning processor 124 and a function approximator 128. The RL agent 120 can be implemented on a processor, such as a GPU, that includes the learning processor 124 and the function approximator 128. The learning processor 124 and the function approximator 128 can also be implemented on different processors that are communicatively coupled together.

The learning processor 124 is configured to cooperate with the function approximator 128 to provide an optimal policy that maximizes a cumulative reward received during the task of routing. The learning processor 124 is directed by a learning algorithm that can be one or more NN, such as convolutional neural networks (CNNs) or graph neural networks (GNN). The learning processor 124 receives the game images and updates the parameters of the function approximator 128 according to at least one of the routing actions, the game images, the rewards, or a combination thereof. As such, the learning processor 124 can update the tunable parameters of the function approximator 128 based on the game images and rewards from the routing environment 110. The learning processor 124 provides parameters for the function approximator 128 that do not depend on each dimension of the game state space of the routing environment 110. Instead, the tunable parameters of the function approximator 128 are independent of the number of nets and/or a design size or part of a design size of a circuit (e.g., the height, the width, or both). The parameters for the function approximator 128 can be based on the number of layers of the game state space.

Figure 2:
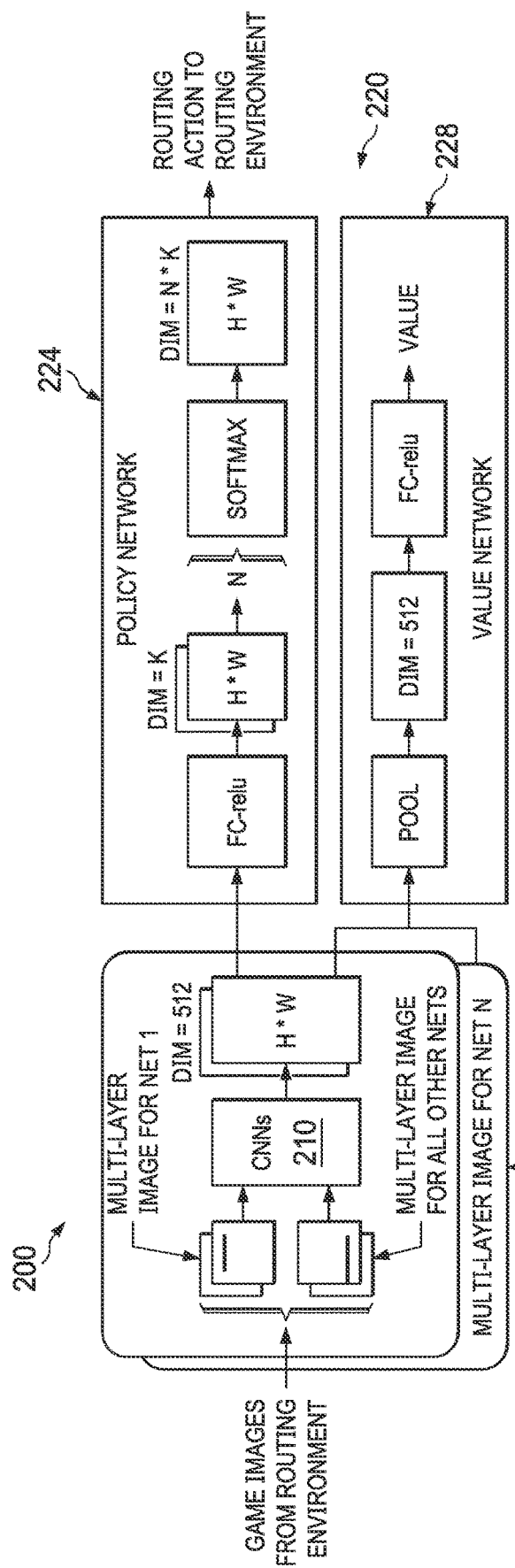
FIG. 2 illustrates a diagram of an example of an architecture of a model of a RL agent for routing nets of a circuit according to the principles of the disclosure.

The function approximator 128 is configured to select the routing actions that are sent to the routing environment 110. The function approximator 128 can select the routing actions based on probabilities of success. FIG. 2 provides an example of using a probability of success for selecting routing actions. The function approximator 128 can be one or more NNs, such as a deep neural network (DNN), or another type of functional network that has tunable parameters. The function approximator 128 can be, for example, a DNN on a processor that includes the one or more NNs of the learning processor 124. The function approximator 128 can include a policy component, also referred to as a policy network, which can use mapping to select the routing actions based on observations from the routing environment 110. The function approximator 128 can also include a value component. The value component, also referred to as a value network, can assign a value or score to the state of a game based on calculating an expected cumulative score for the current game state. The value is a value predictor that can be used in the training process of the RL agent 120, such as training a critic of an actor critic model of RL.

Figure 4:
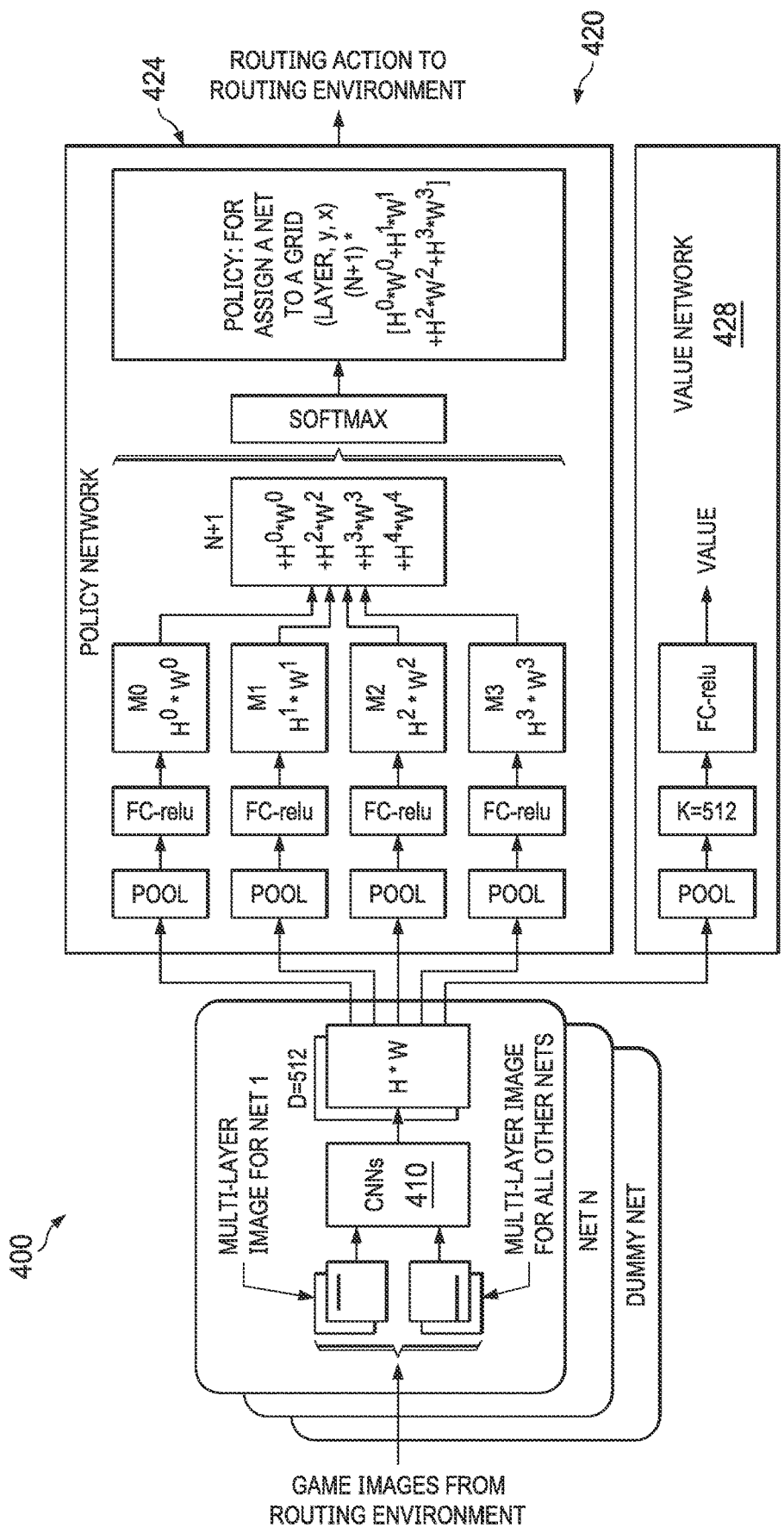
FIG. 4 illustrates a diagram of an example of another architecture of a model of a RL agent for routing nets of a circuit according to the principles of the disclosure.

The function approximator 128 can also select routing actions based on other processes. A deep Q-learning algorithm (a Deep Q-Network (DQN)) can be used, wherein a game state is used as an input and the DQN generates the Q-value of possible routing actions an output. For example, the function approximator 128 can use estimated values of each grid, generate Q values for routing actions, and then use a greedy function to determine what routing action to send to routing environment 110. FIGS. 2 and 4 provide examples of architectures for the RL agent 120.

FIG. 2 illustrates a diagram of an example of an architecture of a model of a RL agent 200 for routing nets of a circuit according to the principles of the disclosure. The RL agent 200 can be used to route one or more, including all, of the nets of a circuit. The RL agent 200 includes a learning processor 210 and a function approximator 220. The function approximator 220 includes a policy network 224 and a value network 228. The RL agent 200 can be implemented using a Proximal Policy Optimization reinforcement algorithm that is GPU enabled (PPO2).

As illustrated, the learning processor 210 is a combination of CNNs that correspond to a deep learning algorithm. As noted above regarding FIG. 1, other NNs, such as GNNs, can also be used. For the following discussing of FIG. 2, the CNNs will be used as example with the element number 210. The CNNs 210 receive game images from a routing environment (not shown in FIG. 2) and generate parameters for the policy network 224 and the value network 228. The policy network 224 predicts the probabilities for each action available at the current game state, while the value network 228 predicts the value of the current state. The policy and value networks 224, 228, are built on top of a game state space of a routing environment, such as routing environment 110 of FIG. 1, which can be used to work-out reinforcement learning algorithms. The policy and value networks 224, 228, of the function approximator 220 can be implemented using one or more NN.

The disclosure advantageously realizes that if the CNNs 210 are naively built based on the game state space, the parameters for the policy network 224 and value network 228, will be dependent on the parameters of the game state space, and the resulting agent can be net number dependent, design size dependent, or both. Additionally, curriculum training of the RL agent 200 will be difficult if not impossible. As such, the CNNs 210 of the RL agent 200 can be net and/or design size independent. The RL agent 200, therefore, is a transferable model that can be trained and inferenced on a different number of nets and circuit design sizes, which allows curriculum training that makes training of large grids and nets feasible.

Regarding the game state space, the RL agent 200 can be used with a grid based three-layer routing environment, such as represented in FIG. 3. The three layers can be terminal, vertical, and horizontal layers. As such, the policy network 224 is constructed for assigning a net to a grid (layer, y, x). The game state space of the routing environment is a four-dimension matrix S[N,K,Y,X], where N is the net ID, K is the layer ID, and Y and X are the vertical and horizontal coordinates of a particular grid. S[n,k,y,x] is set to one when net n is assigned to layer k on (y, x), otherwise zero. In this example, the game state space fully captures the routing configuration of the environment and the action space of the routing environment is assigning a particular net to a particular grid on a particular layer. Therefore, the action space is a discrete action space with a total of N*K*Y*X choices per step. Some actions from an agent are illegal if they overlap with existing routing and will be discarded by the routing environment. Thus, instead of providing a positive reward for an action, the routing environment can send a negative reward to the agent.

As noted above, the RL agent 200 can be net number independent or design size independent and not depend on at least one of N, Y, or X, or can be both net number and design size independent and not depend on N, Y, and X. The CNNs 210 can depend on K since there is a fixed number of layers, which is also true for real routing problems. The RL agent 200, therefore, is a transferable model that can be trained and inferenced on a different number of nets and/or circuit design sizes, which allows curriculum training that makes training of large grids and nets feasible.

For the RL agent 200, two game images are created for each net that is routed by the RL agent 200: one for the routing of the net itself, and one for the routing of everything else, which represents blockages to the particular net. The two game images (each with 3-layers in this example) are fed to a first layer of the CNNs 210 to create an output of an image with a size of (H, W) and a dimension of 512 channels in this example. The resulting image represents the feature space of the particular net. Similarly, the feature space for all N nets can be created as represented by the multi-layer image for net 1 and the multi-layer image for net N in FIG. 2.

The feature space image of each net that is routed is provided to fully connected layers (FC) and nonlinear layer (ReLu) of the policy network 224, to create an array (H, W) with K outputs for each feature space image of the nets 1 to N, i.e., an array (H, W) with a dimension of N*K outputs, which are then combined and applied for softmax classification. N can equal all of the nets or less than all of the nets of the circuit.

For FIG. 2, each layer of the game state space has the same design size, i.e., same H and W. However, as contemplated in FIG. 4, layers of the game state space can have different sizes of H and/or W. The different layers of the game state space can all be mapped into a common grid or a different CNN can be used for the different layers.

The output arrays from the FC-ReLu of the policy network 224 are fed to a final softmax layer that uses a softmax function to create probabilities for each of the (N*K*H*W) actions. The softmax function provides a totality of one for the (N*K*H*W) actions. The RL agent 200 selects the highest rated routing action and sends to the routing environment for the next action.

For the value network 228, the feature space image of each of the N nets is pooled together to form a vector, having a dimension of 512 in this example, and FC-ReLu connected layers of the value network 228 are used to predict one single value for the current game state. The value or score to the state of a game can be based on calculating an expected cumulative score for the current game state and can be used in the training process of the RL agent 200. The RL agent 200 can be agnostic to the number of nets and design size. As such, the weight for the RL agent 200 would not depend on any of the N or H or W parameters. The RL agent 200 can also be agnostic to one of N, H, W, or H and W parameters. FC-ReLu, pool and softmax illustrated in FIG. 2 represent different layers of the NN of the function approximator 220.

As noted above, the RL agent 200 can be used with a grid based three-layer routing environment. To train a RL agent, the routing environment can create random terminal positions for nets as an initial condition for each game. Once a RL agent is trained, a design can be routed with given net terminals by inferencing the RL agent 200 given the current routing state. The RL agent 200 will compute the probability for each action and select the action with highest probability as the routing action.

To adapt the model of FIG. 2 to a 7 nm or 5 nm standard cell routing environment, the game state space and action space can be adjusted to reflect 7 nm routing grids. An additional program can also be used to generate cell layout and check DRCs. For example, various layout editors or generators, can be used to generate cell layout and check DRCs. A Virtuoso layout generator based on simple grid-based commands or other similar programs, including proprietary programs, can be used to check DRCs and generate layouts.

FIG. 2 provides an example of playing the routing game one time, wherein two images are provided to the CNNs 210. Essentially, the layers of the images are concatenated together resulting in three layers for the net and three layers for all the other nets. Each of the layers in this example is a channel resulting in a six channel input to the CNNs 210. With a six channel input, the CNNs generate a matrix having of height H and width W and a dimension of 512. FIG. 3 provides an example of playing the routing game one time, which can provide the two images to the CNNs 210 of FIG. 2.

FIG. 3 illustrates an action sequence of an RL agent to route two nets in an action space 300 of a routing environment of three dimensional space and provides an example of creating three-layer images for a learning processor of a RL agent, such as the RL agent 200. FIG. 3 provides a simple routing problem that demonstrates the feasibility of the disclosed approach. The simple routing problem is a grid based three-layer routing problem that demonstrates an environment that can be used as the basis for a similar model in a real environment that would include, for example, vias and space between routes. In this problem, the three layers are the terminal layer which represents the net terminals; the H layer for horizontal routing only, and the V layer for vertical routing only. Instead of single direction routing, other routing environments can also be used having multiple direction routing layers. The two nets can be all of the nets of a circuit or less than all of the circuit's nets.

An open source tool, such as the GYM environment, can be used for creating the routing environment used with FIG. 3. GYM is a toolkit for developing and comparing RL algorithms and is compatible with multiple numerical computation libraries, including TensorFlow and Theano. Other similar environments can also be used to create the routing environment.

Eleven game steps are shown in FIG. 3 as an example to route the two nets, a first net and a second net. The eleven steps are shown in the three dimensional grid of the routing environment. With each step in this example, one of the grid positions is selected for connecting the terminals of the first net or the terminals of the second net. The grid positions represent connections points that correspond to placing wire on grid space that is defined by the routing environment and according to a policy function, such as discussed in FIG. 1 and FIG. 2. The order of the grid positions selected to connect the terminals of the nets can vary. The routing environment will reward the agent if the terminals are connected in a DRC clean way. Advantageously, the DRC can be checked as the game is being played and when a net is connected. This results in minimizing the number of DRC and maximizing the number of connections that are correct to provide optimized routing. The routing environment can give positive rewards when the DRC decreases and a negative reward can be given when the DRC increases. Non-limiting examples of DRC include space between wires, spaces between vias, and interaction between multiple nets.

The terminal layer, horizontal layer, and vertical layer are shown in the five-by-five grid of the routing environment of FIG. 3. The horizontal layer can be connected to the terminal layer and the vertical layer by vias. Each of the connecting steps of FIG. 3 are initiated by a routing action, such as from a function estimator of FIGS. 1-2. In the beginning of the game, two terminals for each of the first net, terminals 312 and 316, and the second net, terminals 322 and 326, are positioned in the routing environment as shown in step 0. The terminals can be randomly positioned and there is no predetermined order of which net terminals to connect first. The game can simply assign a grid position for a net at each step and can assign grid positions to the two nets randomly. Each of the terminals are located on the terminal layer. Connecting the terminals 312, 316, of the first net begins in step 1 with a single grid position. Steps 2 to 3 show additional grid positions being selected to connect the terminals 312, 316, of the first net. Step 4 shows the connection route 318 between the two terminals 312, 316, of the first net being completed with the selection of another grid position. Each of the grid positions of the connection route 318 connecting the first net terminals 312, 316, is on the horizontal layer above the first net terminals 312, 316, located on the terminal layer. With the completion of the first net, the routing environment provides a reward to the agent. Additionally, the routing environment can provide rewards to the agent when a grid position is selected. For example, a negative reward can be given when the game continues to play one more step, so that the total game steps (equals the total wirelength) will be minimized.

In step 5, connecting the second net terminals 322, 326, begins with the selection of a grid position on the horizontal layer. The game continues in steps 6-9 as the route between the second net terminals 322, 326, is determined by going up and over the connection route 318. In step 10, the connection route 328 between the second net terminals 322, 326, is completed with the selection of another grid position on the horizontal layer above the second net terminal 326. A combination of the horizontal and vertical layers are used to complete the connection route 328 between the second net terminals 322, 326. With the connection route 328 completed, the routing environment provides a reward to the agent. Additionally, the routing environment can provide rewards to the agent when a grid position is selected for the second net. Though not evident from FIG. 3, the rewards for completing the first and second nets are given when the routes comply with the DRC. Accordingly, DRC compliance can be achieved during the routing.

FIG. 3 represents a simple game with two nets in the action space 300 of a routing environment. However, the game is scalable and can be applied to more than two nets, to nets having more than two terminals, and to a combination thereof. A RL agent, such as agent 120 or 200, can be trained using the two nets and then used to inference the designs of other circuits. Curriculum training can be applied to train an RL agent incrementally, such as for problem configurations with larger number of nets and design size. The training can start with only 2 nets and a 5×5 grid design and gradually train with more nets and larger sizes. For example, models that are net and/or design size agnostic can be trained incrementally, wherein (N=2, 5×5), (N=2, 5×30), (N=3, 5×30) and then (N=4, 5×30). Regardless the number of nets being routed or number of terminals, a single connection point (grid position) can be selected with each step in a sequential learning process.

FIG. 4 illustrates a diagram of an example of another architecture of a model of a RL agent 400 for routing nets of a circuit according to the principles of the disclosure. The RL agent 400 can be used for routing at least some of the nets of a circuit including a sub-10 nm FinFET standard cell, such as for a 7 nm cell. To avoid disclosing proprietary FinFET technology node information, the routing layers used with a routing environment can be referred to as M0-Mm, diffusion layer as Diff, and poly layer as Poly. The example of FIG. 4 uses routing layers M0 to M3. As with the RL agent 200, the RL agent 400 can also be implemented using a PPO2. The RL agent 400 includes a learning processor 410 and a function approximator 420. The learning processor 410 can be a combination of NNs, such as CNNs or GNNs. Similar to FIG. 2, the learning processor 410 is a combination of CNNs. For the following discussing of FIG. 4, the CNNs will be used as an example with the element number 410. The function approximator 420 includes a policy network 424 and a value network 428. The function approximator 420 can be a DNN on the same processor, such as a GPU, as the CNNs 410, or one another processor.

Similar to the 3-layer environment used in FIG. 2, the value and policy networks 424, 428, can also be net and/or design size agnostic. For FIG. 2, each layer of the action space in the routing environment has the same grid size of h and w and the game state space has the same size, i.e., same H and W. However, FIG. 4 contemplates that layers of the game state space can have different sizes of H and/or W. Accordingly, there can be multiple layers with different sizes that are mapped to a common grid structure of the routing environment. The routing environment (not shown in FIG. 4) can be used to map components from the routing action space of the routing environment to the common game state space. The game images from the routing environment represent the common game state space. The components from the game state space are then mapped to the action space of the routing environment. Pooling layers of the policy network 424 for each layer of the game images can do the mapping (stride and offsets) from the game state space to the action space of the routing environment. In FIG. 4, the superscripts with the dimensions H and W represent the game state space.

Thus, similar to the 3-layer grid routing environment discussed above regarding FIGS. 2-3, all of the routing, poly and diffusion layers of an example 7 nm cell can be mapped into a common game state space (i.e., an image space). Therefore the game state space can still be S[N,K,Y,X], where N is a number of nets being routed, K is total number of layers, and Y and X are the coordinates of the grid in the routing environment. Design specific mapping rules that are technology dependent can be used when mapping different layers of the routing environment to a common game state space. N can be less than the total number of circuit nets.

For FIG. 4, the action space of the routing environment has different grid sizes for one or more layers. Instead of N*K*X*Y dimensions as in FIG. 2, the action space has (N+1)*(X1*Y1+X2*Y2+ . . . +Xm*Ym) dimensions, wherein m is the number of layers. The number of nets is also N+1 nets, which includes a dummy net that represents routing for a net that is not part of the original circuit. A dummy net may be required to meet DRC rules. A dummy net is an additional routing shape that is not associated with a net but is used to comply with DRC. For example, a particular metal density for connections may be needed to satisfy DRC rules. A dummy net can be used to provide a sufficient amount of metal and verify that the metal density has been satisfied.

For each of the N nets, each layer can also have a different set of action spaces. As an example, only routing layers can be included in the action layer and the poly and diffusion layers are not for routing. Additionally, a common grid structure is used for all layers in the routing environment and the routing action of each layer is to fill a (w, h) design size of grids in the game state space with offset of (ox,oy) and stride (sx,sy). With w,h,sx,sy being different in different layers, then the number of actions per layer is different. The total number of actions of layer i is represented by $(X_i * Y_i)$ where $X_i=(X-w_i-ox_i)/sx_i+1$, $Y_i=(Y-h_i-oy_i)/sy_i+1$.

Unlike the policy network 224, the policy network 424 processes features extracted by the CNNs 410 by pooling H and W for each layer and then providing values of the pooled values to fully connected layers. The N+1 vectors for each of the example routing layers M0-M3 in FIG. 4 resulting after the FC-ReLu layers of the policy network 424 are then concatenated and applied for softmax classification. The predictions are merged for all nets and all layers together to form the new (N+1)*(X1*Y1+X2*Y2+ . . . +Xm*Ym) action policy prediction for routing in the routing environment.

The value network 428 pools H and W for all of the nets from the CNNs 410 and provides a vector, having a dimension of 512 in this example, to the FC-ReLu connected layers to predict one single value for the current game state. FC-ReLu, pool and softmax illustrated in FIG. 4 represent different layers of the NN of the function approximator 420.

Figure 5:
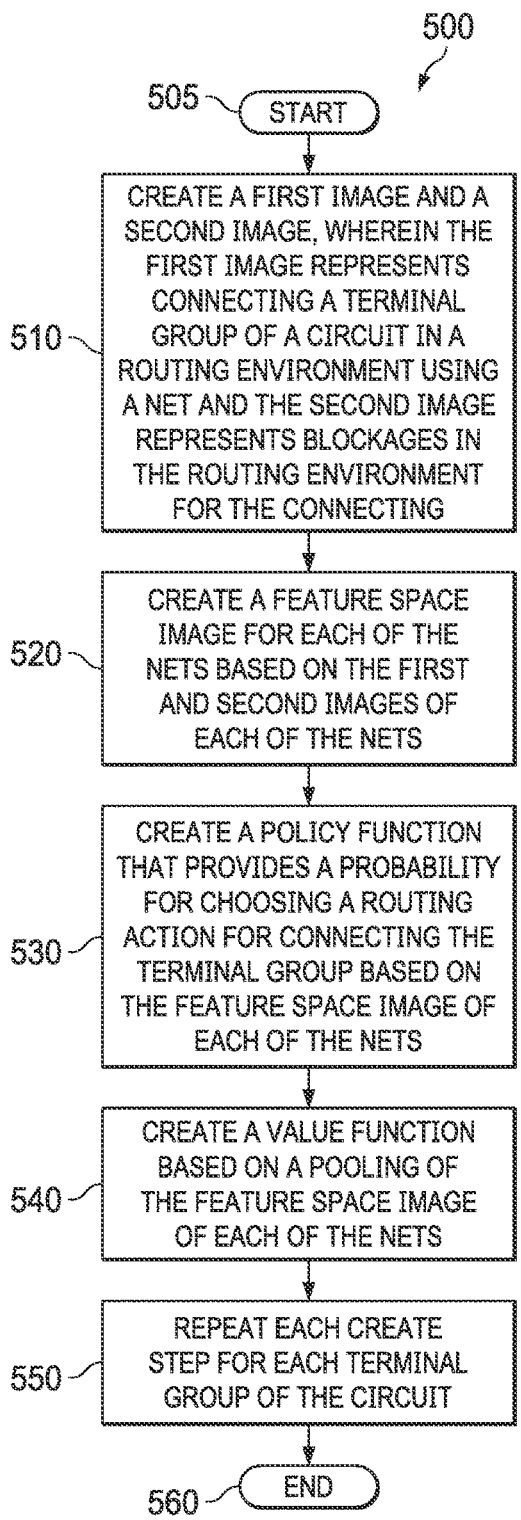
FIG. 5 illustrates a flow diagram of an example of a method of creating a model for routing nets of circuits using reinforcement learning according to the principles of the disclosure.

FIG. 5 illustrates a flow diagram of an example of a method 500 of constructing a model for routing nets of circuits using reinforcement learning and carried out according to the principles of the disclosure. The nets can be used to connect terminal groups of the circuit. The circuit can have multiple groups, such as pairs, of terminals to connect. One or more processor can be used to perform method 500 and the method 500 can be automated. A routing environment, which is a game environment having a grid space for connecting terminals using nets, can also be used in the creation of the model. For example, learning processors and routing environments such as disclosed herein can be used. The grid space of the routing environment can be a three dimensional grid. The model created by the method 500 can be for an RL agent, such as RL agent 120, 200, and 400. The method 500 can be used for less than all of the nets of the circuit. As such, nets used in the below discussion of the method 500 can be at least some of the nets of the circuit. The method 500 begins in step 505.

In step 510, a first and second image are created, wherein the first image represents connecting a terminal group in a routing environment using a net and the second image represents blockages in the routing environment for the connecting. The first and second images have multiple routing layers and are created for each of the nets being routed. The routing layers can be for routing in a single direction, routing in multiple directions, or a combination of both single and multiple direction routing. The first and second images can be game images that correspond to a game state space from the routing environment. The routing environment can create the game images.

A feature space image for each of the nets is created in step 520 based on the first and second images of each of the nets. The feature space image for each of the nets is defined by a height and width corresponding to a grid of the routing environment. The height, width or both can be different for different layers of the grid of the routing environment. If different, the dimensions can be mapped to a common grid, such as by the policy network 424 of FIG. 4. One or more CNN, such as the CNN 210 or 410 of FIGS. 2 and 4, can be used to create the feature space images.

In step 530, a policy function is created that provides a probability for choosing a routing action for connecting the terminals based on the feature space image of each of the nets. The policy function has tunable parameters that are independent of a number of the nets and a size of the circuit. Creating the policy function can include applying the feature space image of each of the nets to FC-ReLu layers of a NN to create an array with outputs, combining all the outputs of the nets to generate a combined output, and providing the combined output to a softmax layer of the NN to create the probability for choosing a routing action. The policy network 224 and the policy network 424 provide examples of generating a policy function.

A value function is created in step 540 based on a pooling of the feature space image of each of the nets. The value function provides a value predictor for a current routing state for the terminal group. Creating the value function can include applying a vector generated by the pooling to FC-ReLu layers of a NN to provide a single value for the value predictor. The value network 228 and the value network 428 provide examples of generating a value predictor.

In step 550, steps 510 to 540 are repeated for each group of terminals of the circuit being considered. Once all of the nets of the circuit being routed are connected, the model is completed and can be used for routing nets of a circuit. The model is a transferable model that can be trained and inferenced on a different number of nets and/or circuit design sizes. As such, the model can be used for curriculum training that makes training of large grids and nets feasible. An initial number of two nets can be used to generate the model. The method continues to step 560 and ends with a model for an RL agent.

Figure 6:
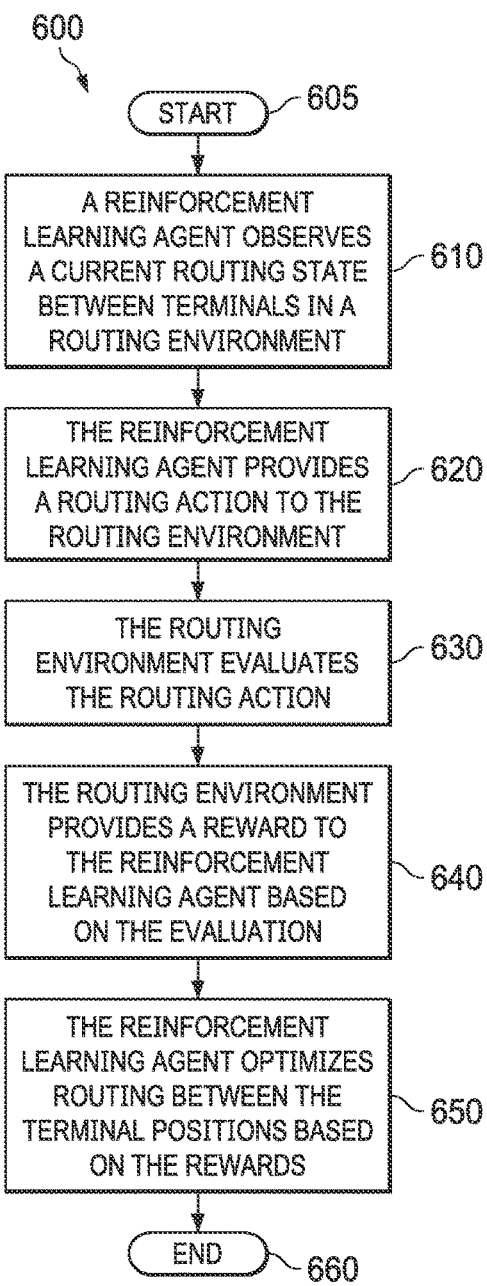
FIG. 6 illustrates a flow diagram of an example of a method of training a RL agent, employing a game, to determine routing connections for circuits according to the principles of the disclosure.

FIG. 6 illustrates a flow diagram of an example of a method 600 of training a RL agent, employing a game, to determine routing connections for circuits according to the principles of the disclosure. The RL agent can be trained incrementally, such as via curriculum training. One or more processor can be used to perform method 600 and the method 600 can be automated. A routing environment can also be used for the training. For example, learning processors and routing environments such as disclosed herein can be used. The RL agent can be implemented using a Proximal Policy Optimization algorithm. The method 600 begins in step 605.

In step 610, an RL agent observes a current routing state between terminals in a routing environment. The terminals can be randomly positioned in a grid of the routing environment. The grid can be a three dimensional grid. The terminals can be a terminal group of a circuit net that are positioned in the routing environment. The RL agent can observe the current routing state, also referred to as current game state, via game images generated by routing environment.

A routing action is provided to the routing environment from the RL agent in step 620. The routing action changes the current routing state between the terminal positions in the routing environment and is based on a model for routing nets that is independent of a number of the nets and/or a size of the circuit. The model provides a probability for choosing a routing action for connecting the terminal positions based on a feature space image of the nets and provides a value predictor for a current routing state for the terminal positions based on a pooling of the feature space image of the nets. The method 600 of training can be repeated multiple times and the number of the nets and/or a size of the circuit or routing environment incrementally increase each of the multiple times to create additional models for training. An initial number of the nets for the model can be two. The model can be created, for example, by the method 500.

In step 630, the routing action is evaluated by the routing environment. The routing environment can evaluate, for example, by determining the routing action completes a connection between a terminal group and if the routing action complies with DRC.

A reward based on the evaluating is provided to the RL agent from the routing environment in step 640. The reward can be a reward that indicates legality of a routing action, which indicates whether the routing action created a connected routing segment, which indicates when a net is fully routed, etc. More than one reward can be given for each routing action.

In step 650, the RL agent optimizes routing between the terminal positions based on the rewards. The RL agent can optimize the routing by selecting routing actions that return the most rewards. The RL agent can complete a net by optimizing the routing between the terminal positions.

Steps 610 to 650 can be repeated for each net terminal group of the circuit being considered, such as for all of the nets or less than all of the nets. An initial number of the nets can be two. The number of nets and the size of circuits can be increased for the training, such as for curriculum training. Method 600 continues to step 660 and ends with a trained model that can be used for routing connections in circuits.

FIG. 7 illustrates a flow diagram of an example of a method 700 of determining routing connections between terminal groups of a circuit employing a game process and a RL agent according to the principles of the disclosure. The method 700 can be automatically performed by one or more processor. One or more processor can be used to perform method 600 and the method 600 can be automated. A routing environment can also be used. For example, learning processors and routing environments such as disclosed herein can be used for at least a portion of the method 700. The RL agent can be, for example, the RL agent of FIGS. 1, 2, and 4. The method 700 begins in a step 705.

In step 710, a circuit design is received having known terminal groups. The circuits can be an IC of various technology nodes, including FinFET technology at 7 nm and 5 nm. The circuits can be standard cells or manual designs. The circuit design can indicate the number of nets and the terminal groups for each of the nets of the circuit. The circuit design can include a netlist that provides the net and terminal group data.

Terminal positions for the terminal groups are established in a routing environment in a step 720. The terminals can be positioned in a grid, such as a three dimensional grid, by the routing environment. The terminals can be randomly positioned in the routing environment. The routing environment can be an open source tool, such as the GYM environment, or another toolkit for developing and comparing RL algorithms. The terminals of at least some of the nets can be positioned and routes for that net determined before positioning terminals of subsequent nets in the routing environment. The terminals for each of the nets can be used.

In a step 730, routing actions are performed in the routing environment. The routing actions are generated by the RL agent and sent to the routing environment. Each of the routing actions select a grid position in the action space of the routing environment for connecting a terminal group. As such, multiple routing actions are generated by the RL agent and sent to the routing environment for connecting the terminal group of at least some of the nets. After a net is completed, routing actions for a subsequent net are generated until each net to be routed is completed.

Current game states within a routing environment are observed in step 740. The RL agent can observe the game states based on game images generated by the routing environment for the current routing state. The game images for a net correspond to a game state space from the routing environment and include a first image that represents connecting a terminal group in a routing environment using a net and a second image that represents blockages in the routing environment for the connecting. The game images can have multiple routing layers and can be for routing in a single direction, routing in multiple directions, or a combination of both single and multiple direction routing. The RL agent can create feature space images from the game images and use the feature space images to tune parameters for selecting routing actions. The game states are observed in sequential order for each routing state of a first net, and then for each routing state of subsequent nets.

In step 750, routes of nets between the known terminal groups are determined employing the RL agent. Advantageously, the RL agent is based on a model that is independent of a number of the nets and/or a size of the circuit. Determining the routes of the nets can be performed by inferencing the model.

The RL agent can determine the routes of the nets based on rewards received from the routing environment when evaluating the routing actions from RL agent. For example, the routing environment can receive routing actions from the RL agent that change the routing state, evaluate the routing actions in the routing environment, and reward the RL agent based on the evaluating. The RL agent can select the routing action to send to the routing environment by computing the probability of available routing actions using the feature space images and selecting the routing action that has a higher probability than remaining ones of the routing actions. The route to connect the terminal groups of nets can be based on the routing actions that produce the highest reward value to the RL agent. The routes for nets can be determined sequentially, wherein a first net is completed, then a subsequent net, then the next net, etc.

The rewards are provided by the routing environment and include a reward that indicates legality of the routing action, a reward that indicates whether the routing action created a connected routing segment between known terminals, and a reward that indicates when a net is fully routed. The rewards can further include a reward for design rule checks. The method 700 continues to step 760 and ends.

The routed nets from the method 700 can be used in a design flow to produce the circuit. For example, the routed nets can be used in the physical design portion of a design flow that includes planning the layout of the different electrical components, placing the electrical components, and determining the routing of the connections between terminals of the electrical components.

The method 700 can be used to determining net routes for ICs that are standard cells. Accordingly, the method 700 can be used to create a cell library of standard cells. The standard cell library can be for FinFET technology nodes that are less than 10 nm, such as 7 nm and 5 nm. One or more of the standard cells created by the method 700 can be used to construct a GPU.

At least a portion of methods 500, 600, and 700 can be implemented as a computer program product having a series of operating instructions stored on a non-transitory computer-readable medium that directs a processor when executed thereby to perform operations of the method. FIG. 8 provides an example of a computing system having a processor that can be used for at least a portion of the methods 500 to 700, and the RL agents disclosed herein.

FIG. 8 illustrates a block diagram of an example of a computing system 800 in which at least a portion of the disclosed systems, methods, or apparatuses disclosed herein can be implemented. Computing system 800 provides an example of a parallel processing unit, GPU 805, included in a system with one or more other devices. Computing system 800 can be embodied on a single semiconductor substrate and can include other devices such as additional GPUs. GPU 805 can be coupled to the additional GPUs via one or more interconnects, such as high-speed interconnects. GPU 805 can be coupled to processor 850, such as or host processor and a memory 880. The processor 850 can be another GPU or a host processor such as a CPU. The memory 880 can include multiple memory devices. GPU 805 includes an interface 810, control units 820, a memory interface 830, and processing cluster 840. GPU 805 can include additional components that are not illustrated but typically included in a GPU, such as communication busses and interconnects. The computing system 800, or at least a portion of the computing system, can be on a cloud computing platform. For example, the GPU 805, the processor 850, the memory 880, or a combination of two or more can be on a server located in a cloud computing environment, such as in a data center. The data center can be a GPU data center. One or more of the GPU 805, the processor 850, and the memory 880 can also be distributed on different computing devices and the computing devices can be distal from one another. For example, the processor 850 and memory 880 can be located on one computing device or system and the GPU 805 can be located on another computing device or system.

Interface 810 is an input and output interface configured to communicate data, commands, and other information, with external components, such as the processor 850. Interface 810 can transmit and receive data and commands over conventional interconnects. The interface 810 can be connected to a routing environment to receive input data. For example, the data can be game images and rewards used for constructing, training, and employing a routing model for an RL agent. Received communications can be sent to the various components of GPU 805, such as control units 820. Control units 820 are configured to manage processing streams, configure processing cluster 840 for processing tasks defined by the streams, distribute the tasks to processing cluster 840, and manage the execution of the tasks on processing cluster 840. The results generated by the tasks can be directed to memory interface 830. Memory interface 830 is configured to store the results in a memory, such as memory 880. For example, routed nets for an IC can be stored in the memory 880. In addition to writing to memory 880, memory interface 830 is also configured to read data from memory 880. The memory 880 can also store software or code corresponding to algorithms for constructing a model for a RL agent and/or routing connections in an IC using the model as disclosed herein, such as represented in FIGS. 2-7. The code can direct operations of the processing cluster 840. The memory 880 can be or include a non-transitory computer readable medium.

Processing cluster 840 includes multiple processing cores for processing the tasks. The processing cores can be optimized for matrix math operations and can be employed for training NNs, such as training a RL agent as disclosed herein. The processing cores can also be employed for constructing a model for a RL agent and routing connections in an IC using the model. Processing cluster 840 can include a pipeline manager that directs the operation of the processing cores for parallel processing of the tasks. Processing cluster 840 can also include additional components for processing the tasks, such as a memory management unit.

A portion of the above-described apparatus, systems or methods may be embodied in or performed by various digital data processors or computers, wherein the computers are programmed or store executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions, systems or apparatuses described herein.

The digital data processors or computers can be comprised of one or more GPUs, one or more CPUs, one or more of other processor types, or a combination thereof. The digital data processors and computers can be located proximate each other, proximate a user, in a cloud environment, a data center, or located in a combination thereof. For example, some components can be located proximate the user and some components can be located in a cloud environment or data center.

The GPUs can be embodied on a single semiconductor substrate, included in a system with one or more other devices such as additional GPUs, a memory, and a CPU. The GPUs may be included on a graphics card that includes one or more memory devices and is configured to interface with a motherboard of a computer. The GPUs may be integrated GPUs (iGPUs) that are co-located with a CPU on a single chip. Configured means, for example, designed, constructed, or programmed, with the necessary logic and/or features for performing a task or tasks.

The processors or computers can be part of GPU racks located in a data center. The GPU racks can be high-density (HD) GPU racks that include high performance GPU compute nodes and storage nodes. The high performance GPU compute nodes can be servers designed for general-purpose computing on graphics processing units (GPGPU) to accelerate deep learning applications. For example, the GPU compute nodes can be servers of the DGX product line from Nvidia Corporation of Santa Clara, California.

The compute density provided by the HD GPU racks is advantageous for AI computing and GPU data centers directed to AI computing. The HD GPU racks can be used with reactive machines, autonomous machines, self-aware machines, and self-learning machines that all require a massive compute intensive server infrastructure. For example, the GPU data centers employing HD GPU racks can provide the storage and networking needed to support large-scale deep neural network (DNN) training, such as for the NNs disclosed herein that are used for routing nets.

The NNs disclosed herein include multiple layers of connected nodes that can be trained with input data to solve complex problems. For example, the input images can be game images used as input data for constructing, training, and employing a routing model for an RL agent. Once the NNs are trained, the NNs can be deployed and used to identify and classify objects or patterns in an inference process through which a NN extracts useful information from a given input. For example, the NNs can be used to determine connections between terminals groups of the nets of circuits.

During training, data flows through the NNs in a forward propagation phase until a prediction is produced that indicates a label corresponding to the input. When the NNs do not correctly label the input, errors between the correct label and the predicted label are analyzed, and the weights are adjusted for features of the layers during a backward propagation phase that correctly labels the inputs in a training dataset. With thousands of processing cores that are optimized for matrix math operations, GPUs such as noted above are capable of delivering the performance required for training NNs for artificial intelligence and machine learning applications.

Portions of disclosed embodiments may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

Those skilled in the art to which this application relates will appreciate that other and further additions, deletions, substitutions and modifications may be made to the described embodiments. It is also to be understood that the terminology used herein is for the purpose of describing particular embodiments only, and is not intended to be limiting, since the scope of the present disclosure will be limited only by the claims. Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, a limited number of the exemplary methods and materials are described herein.

Each of the aspects disclosed in the Summary may have one or more of the additional features of the dependent claims in combination. It is noted that as used herein and in the appended claims, the singular forms "a", "an", and "the" include plural referents unless the context clearly dictates otherwise.

What is claimed is:

1. A method of creating a model for routing nets of circuits using reinforcement learning, comprising:
   creating a first image that represents connecting a group of terminals of a circuit in a routing environment using a net and a second image that represents blockages in the routing environment for the connecting, wherein the first and second images have multiple routing layers and are created for at least some of the nets of the circuit;
   creating, using a neural network (NN), a game state image for the at least some of the nets; and
   creating a policy function that provides a probability for choosing a routing action for connecting the group of terminals based on the feature space image of the at least some of the nets, wherein parameters of the policy function are independent of a number of the nets of the circuit and the game state image is based on the first and second images of the at least some of the nets.

2. The method as recited in claim 1, wherein the feature space image for the at least some of the nets is defined by a height and width.

3. The method as recited in claim 2, wherein the height or width for multiple of the feature space images are different.

4. The method as recited in claim 1, further comprising creating a value function, based on a pooling of the feature space image of the at least some of the nets, that provides a value predictor for a current routing state for the group of terminals.

5. The method as recited in claim 4, wherein the creating the value function includes applying a vector generated by the pooling to fully connected layers (FC) and nonlinear layer (ReLu) of the NN to provide a single value for the value predictor.

6. The method as recited in claim 4, wherein the creating the value function is based on a pooling of the feature space image of all of the nets.

7. The method as recited in claim 1, wherein the creating the policy function includes applying the feature space image of at least some of the nets to fully connected layers (FC) and non-linear layers (ReLu) of the NN to create an array with outputs, combining all the outputs of the at least some of the nets to generate a combined output, and providing the combined output to a softmax layer of the NN to create the probability for choosing a routing action.

8. The method as recited in claim 1, wherein the creating the first and second images is for all of the nets, the creating the feature space image is for all of the nets, and the creating the policy function is based on the feature space image of all of the nets.

9. The method as recited in claim 1, wherein the routing layers at least include a terminal layer, a vertical layer, and a horizontal layer.

10. The method as recited claim 1, wherein at least one of the routing layers is a multiple-direction routing layer.

11. The method as recited in claim 1, wherein the routing environment is a three dimensional grid.

12. The method as recited in claim 1, wherein an initial number of the nets is two.

13. The method as recited in claim 1, wherein the parameters of the policy function are additionally independent of a size of the circuit.

14. The method as recited in claim 1, wherein the NN is a graph neural network (GNN).

15. The method as recited in claim 1, wherein the NN is a convolutional neural network (CNN).

16. A method of training a Reinforcement Learning (RL) agent, employing a game, to determine routing connections for circuits, comprising:
observing, by the RL agent, a current routing state between terminal positions of a circuit in a routing environment;
providing, from the RL agent to the routing environment, a routing action that changes the current routing state between the terminal positions, wherein the RL agent provides the routing action based on a model for routing nets that is independent of a number of the nets of the circuit and game state images from the routing environment that include images for routing of the nets and images representing blockages of the nets;
evaluating, by the routing environment, the routing action; and
providing, from the routing environment to the RL agent, one or more reward based on the evaluating.

17. The method as recited in claim 16, wherein a number of the nets for the model is two.

18. The method as recited in claim 17, wherein the method is repeated multiple times and the number of the nets and a size of the circuit incrementally increase during the multiple times to create additional models for the method of training.

19. The method as recited in claim 16, wherein the model provides a probability for choosing routing actions for connecting the terminal positions based on a feature space image of the nets and provides a value predictor for a current routing state for the terminal positions based on a pooling of the feature space image of the nets.

20. The method as recited in claim 16, wherein the RL agent is implemented using a Proximal Policy Optimization algorithm.

21. The method as recited in claim 16, wherein the RL agent optimizes routing between the terminal positions based on the one or more rewards.

22. The method as recited in claim 16, wherein the one or more awards include a reward that indicates legality of a routing action, an award that indicates whether the routing action created a connected routing segment, and an award that indicates when a net is fully routed.

23. The method as recited in claim 16, wherein the model for routing nets is further independent of a size of the circuit.

24. A method of determining routing connections between terminals of a circuit employing a game process for a Reinforcement Learning (RL) agent, comprising:
receiving a circuit design having known terminal groups;
establishing terminal positions for the known terminal groups in a routing environment; and
determining, by the RL agent, routes of nets between the known terminal groups employing a model that is independent of a number of the nets of the circuit and game state images from the routing environment that include images for routing of the nets and images representing blockages of the nets.

25. The method as recited in claim 24, wherein the determining includes receiving routing actions from the RL agent that change routing states, evaluating the routing actions in the routing environment, rewarding the RL agent with one or more rewards based on the evaluating, and selecting routing actions for the routes of the nets based on the one or more rewards.

26. The method as recited in claim 25, wherein the determining further includes the RL agent computing the probability of the routing actions and selecting routing actions to send to the routing environment that have a higher probability than remaining ones of the routing actions.

27. The method as recited in claim 25, wherein the one or more rewards are provided by the routing environment and include a reward that indicates legality of the routing action, a reward that indicates whether the routing action created a connected routing segment between a pair of the known terminal groups, and a reward that indicates when a net is fully routed.

28. The method as recited in claim 27, wherein the one or more rewards further include a reward for design rule checks.

29. The method as recited in claim 24, wherein the determining the routes of the nets is performed by inferencing the model.

30. The method as recited in claim 24, wherein the method is an automated method.

31. The method as recited in claim 24, wherein the model is independent of the number of the nets of the circuit and a size of the circuit.

32. The method as recited in claim 24, wherein the circuit design is for a standard cell.

33. A computer program product having a series of operating instructions stored on a non-transitory computer-readable medium that directs a processor when executed thereby to perform operations that include:
receiving a circuit design having known terminal groups;
establishing terminal positions for the known terminal groups in a routing environment; and
determining, by the RL agent, routes of nets between the known terminal groups employing a model that is independent of a number of the nets of the circuit and game state images from the routing environment that include images for routing of the nets and images representing blockages of the nets.

34. A computing system, comprising:
one or more processors to perform operations including:
receiving a circuit design having known terminal groups;
establishing terminal positions for the known terminal groups in a routing environment; and
determining, by the RL agent, routes of nets between the known terminal groups employing a model that is independent of a number of the nets of the circuit and game state images from the routing environment that include images for routing of the nets and images representing blockages of the nets.

35. The computing system as recited in claim 34, wherein the determining includes receiving routing actions from the RL agent that change routing states, evaluating the routing actions in the routing environment, rewarding the RL agent with one or more rewards based on the evaluating, and selecting routing actions for the routes of the nets based on the one or more rewards.

36. The computing system as recited in claim 35, wherein the one or more rewards include a reward for checks of design rules for the circuit.

37. A Reinforcement Learning (RL) Agent for routing connections of a circuit, comprising:
a function approximator that generates routing actions for connecting terminal groups of nets of the circuit based on probabilities for taking different routing actions, and sends the routing actions to a routing environment; and
a learning processor that receives game state images from the routing environment and provides therefrom parameters for the function approximator that are independent of a number of nets of the circuit, wherein the game state images include images for routing of the nets and images representing blockages of the nets.

38. The RL agent as recited in claim 37, wherein the function approximator is one or more neural network and includes a policy network that employs the parameters and generates the routing actions.

39. The RL agent as recited in claim 37, wherein the learning processor is one or more convolutional neural network.

40. The RL agent as recited in claim 37, wherein the game state images includes two images created for each of the nets, wherein one of the images is for the routing of one of the nets itself, and the other one of the images is for the routing of the other ones of the nets, which represents blockages to the routing of the one of the nets.

41. The RL agent as recited in claim 37, wherein the parameters provided by the learning processor are further independent of a design size of the circuit.

\* \* \* \* \*